United States Patent
Wershoven

(10) Patent No.: US 7,550,679 B1
(45) Date of Patent: Jun. 23, 2009

(54) ACTIVE ELECTROMAGNETIC FILTER

(76) Inventor: Mark Wershoven, 1746 N. Cherokee Ave., #3N, Hollywood, CA (US) 90028

( * ) Notice: Subject to any disclaimer, the term of this patent is extended or adjusted under 35 U.S.C. 154(b) by 554 days.

(21) Appl. No.: 11/287,258

(22) Filed: Nov. 28, 2005

Related U.S. Application Data

(60) Provisional application No. 60/632,239, filed on Nov. 30, 2004.

(51) Int. Cl.
*H05K 9/00* (2006.01)
(52) U.S. Cl. .................. 174/377; 361/816
(58) Field of Classification Search .......... 174/350, 174/377; 361/816, 818, 800
See application file for complete search history.

(56) References Cited

U.S. PATENT DOCUMENTS

| | | | |
|---|---|---|---|
| 4,814,546 A * | 3/1989 | Whitney et al. ............. 174/36 |
| 5,639,989 A * | 6/1997 | Higgins, III ................. 174/386 |
| 5,814,761 A * | 9/1998 | Piazza ........................ 174/377 |
| 5,841,067 A * | 11/1998 | Nakamura et al. .......... 174/382 |
| 5,990,417 A * | 11/1999 | Senda et al. ................ 174/391 |
| 6,388,893 B1 * | 5/2002 | Calderon .................... 361/818 |
| 6,472,598 B1 * | 10/2002 | Glenn ......................... 174/535 |
| 6,476,317 B1 * | 11/2002 | Frederickson et al. ...... 174/350 |
| 6,552,916 B1 * | 4/2003 | Stromberg .................. 361/816 |
| 6,596,937 B2 * | 7/2003 | Mazurkiewicz ............. 174/394 |
| 6,646,198 B2 * | 11/2003 | Maciver et al. ............. 174/359 |
| 6,653,557 B2 * | 11/2003 | Wolf et al. .................. 174/386 |
| 6,707,687 B2 * | 3/2004 | Kogasaka et al. ........... 361/800 |
| 6,826,828 B1 * | 12/2004 | Shen ........................... 29/832 |
| 7,091,412 B2 * | 8/2006 | Wang et al. ................. 174/391 |
| 2001/0033478 A1 * | 10/2001 | Ortiz et al. .................. 361/818 |
| 2003/0146482 A1 * | 8/2003 | Doi ............................ 257/432 |

* cited by examiner

*Primary Examiner*—Hung V Ngo

(57) ABSTRACT

Exemplary embodiments disclosed herein may include two layers with a crystal positioned therebetween. Electromagnetic radiation sources may be positioned adjacent the crystal layer. A thin shield may then enclose this entire assembly. A small flat magnet may be positioned adjacent to the shield, with the opposite side of the magnet adjacent a sealed barrier. The item to be protected may be adjacent the opposite side of the barrier.

1 Claim, 1 Drawing Sheet

ACTIVE ELECTROMAGNETIC FILTER

RELATED APPLICATIONS

The present application is a continuation-in-part application of U.S. provisional patent application, Ser. No. 60/632,239, filed Nov. 30, 2004, for EMI/RFI FILTER, by Mark S. Wershoven, included by reference herein and for which benefit of the priority date is hereby claimed.

FIELD OF THE INVENTION

The present invention relates to . . . and, more particularly, to . . . a electromagnetic filter

BACKGROUND OF THE INVENTION

Electromagnetic interference (EMI) and radio frequency interference (RFI) is a pervasive problem throughout the electronics industry. EMI and RFI filters are often used to suppress unwanted radiation of electromagnetic waves. Electromagnetic radiation from the external environment compromises electromagnetic compatibility performance and can impair the operation of the electronic circuitry. EMI and RFI suppression is necessary for the entire electromagnetic product or system since it is subject to regulation by various authorities because stray fields from electromagnetic equipment can disrupt other surrounding electromagnetic equipment. Electronic apparatuses may be equipped with some internal circuits and electric parts that generate undesirable electromagnetic waves. In particular, integrated circuits among others process high frequency signals and therefore may cause high frequency leakage leading to radio frequency interference (RFI). Where practical EMI and RFI emissions are minimized by circuit design and track layout. Electromagnetic filters currently used for EMI and RFI suppression may incorporate capacitors, inductors or transformers. They all have insertion loss and may not be very effective even though they are readily used. Additionally, ferrite materials are often used to dissipate undesirable electromagnetic energy present on electronic circuit boards and enclosures, electromagnetic components, signal carrying wires and power cables which may be inefficient and may absorb some of the Ac/Dc signal or power which may be problematic for use with electronics and in other applications. Each electromagnetic component operates using a system of charged carriers. Electromagnetic field energy radiation more commonly can impair the performance of each electromagnetic component and may affect the flow of the charged carriers, the flow inducing a surrounding electromagnetic field. This surrounding electromagnetic field may cause a sufficient disturbance to the electromagnetic component and surrounding electromagnetic components that the performance of the Electromagnetic components is degraded. EMI and RFI solutions usually involve by necessity electromagnetic filters, metal oxide magnetic materials (ferrites) or containment by shielding using a Farraday cage. EMI and RFI solutions currently used have many drawbacks including insertion loss, ineffectiveness and degradation of signals or items to be protected. What is needed is a filter with little insertion loss and magnetic stabilization properties which may provide enhanced protection and performance of an item from unwanted electromagnetic fields at a relatively low cost.

It is therefore an object of the invention to . . . reduce electromagnetic interference and radio frequency interference It is another object of the invention to . . . reduce electromagnetic radiation It is another object of the invention to . . . stabilize magnetic fields It is another object of the invention to . . . provide a active electromagnetic filter at a relatively low cost

SUMMARY OF THE INVENTION

Exemplary embodiments disclosed herein may include two layers with a crystal positioned therebetween. Electromagnetic radiation sources may be positioned adjacent the crystal layer. A thin shield may then enclose this entire assembly. A small flat magnet may be positioned adjacent to the shield, with the opposite side of the magnet adjacent a sealed barrier. The item to be protected may be adjacent the opposite side of the barrier.

BRIEF DESCRIPTION OF THE DRAWINGS

A complete understanding of the present invention may be obtained by reference to the accompanying drawings, when considered in conjunction with the subsequent, detailed description, in which.

For purposes of clarity and brevity, like elements and components will bear the same designations and numbering throughout the Figures.

DESCRIPTION OF THE PREFERRED EMBODIMENT

Figure 1:
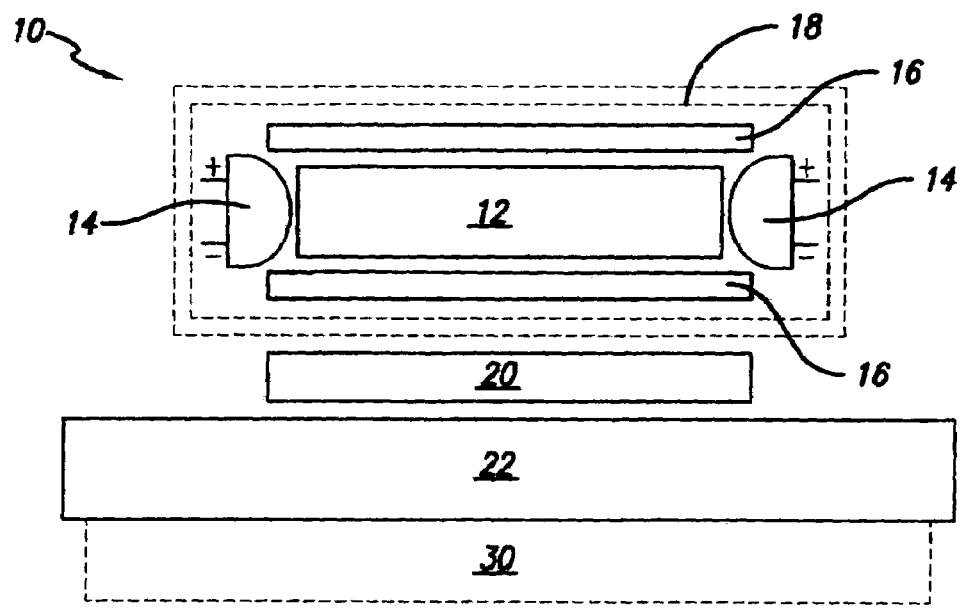
FIG. 1 is a FIG. 1 is a side, elevational, cut-away view of an exemplary embodiment of an active electromagnetic filter.

FIG. 1 is a side, elevational cut-away view of an exemplary embodiment of an active electromagnetic filter.

Figure 2:
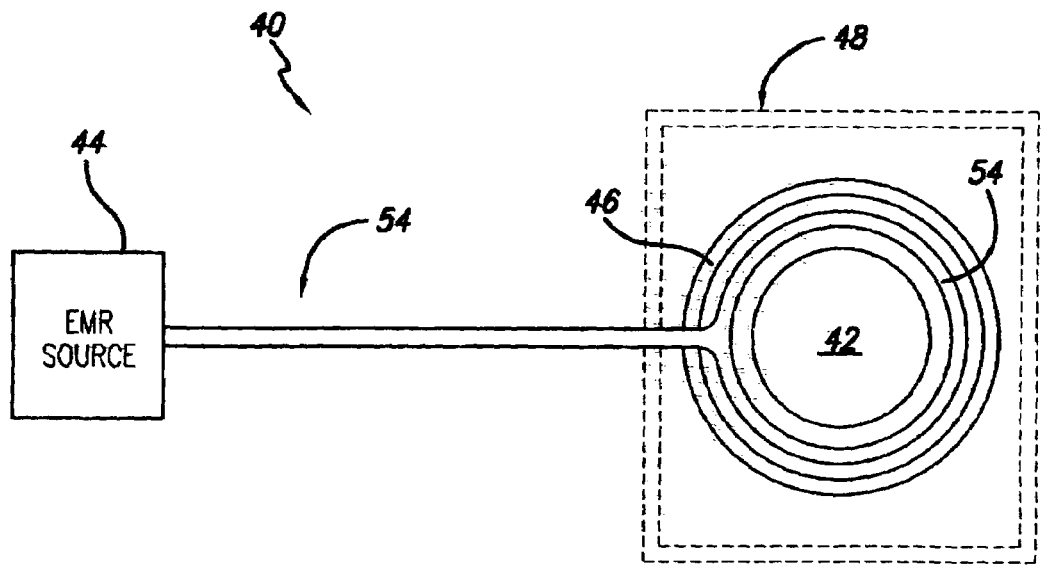
FIG. 2 is a top, cut-away view view of a FIG. 2 is a top, cut-away view of an exemplary embodiment of an active electromagnetic filter.

FIG. 2 is a top, cut-away view of an exemplary embodiment of an active electromagnetic filter.

The detailed description set forth below is intended as a description of exemplary embodiments and is not intended to represent the only forms in which these embodiments may be constructed or utilized. The description sets forth the functions and the sequence of the steps for constructing and operating the exemplary embodiments. However, it is to be understood that the same or equivalent functions and sequences may be accomplished by different embodiments that are also intended to be encompassed within the spirit and scope of this disclosure. The present invention provides methods and systems for reducing electromagnetic interference (EMI)/radio frequency interference (RFI) and to prevent the impingement and emission of the electromagnetic field energy while stabilizing the magnetic field energy in and around the item to be protected/circuitry 30. An active Electromagnetic filter according to the present invention is shown in FIG. 1, generally at system 10. System 10 may include a crystal 12 between two layers 16. Furthermore, system 10 may include an internal electromagnetic radiation source 14 placed in spaced relation to the crystal 12. System 10 may then include a shield 18 which may enclose the crystal 12, internal electromagnetic radiation source 14, and layers 16. System 10 may further include a thin layer magnet 20 positioned adjacent the shield 18. Located on the opposite side of magnet 20 may be barrier 22. The opposite side of which may then be adjacent item to be protected/circuitry 30. Crystal 12 may be crystalline mineral aventurine in the medium red color range. Aventurine quartz contains inclusions of small crystals that reflect light and give a range of colors, depending on the nature of the inclusion. One such inclusion results in orange varieties. Medium red aventurine is an orange variety aventurine quartz generally described as translucent and light absorption can vary enormously according to the nature and thickness of the substance. For crystal 12 substances, which have a diverse arrangement of atoms in different directions, the reduction in velocity of the light generally varies with direction, so that there is more than one refractive index. The aventurine crystal 12 may be activated by the radiation from the internal electromagnetic radiation source 14. Medium red aventurine may have magnetic properties when activated by specific radiation wavelengths. Furthermore, aventurine may have magnetic properties when charged by a magnetic field, which may enhance the properties of barrier 22. Layers 16 may be two thin circular silver metal wafers arranged in a sandwich-type configuration with crystal 12 therebetween. The circular silver metal wafers 16 according to the present invention can be produced from 28-gauge silver metal sheets. 28-gauge metal sheets were preferred in construction of the silver metal wafers 16, however any gauge metal sheet may be used and is not critical. Generally, the diameter of the circular metal wafers 16 will be dependent on the surface area of the item to be protected/circuitry 30 and therefore will be critical to achieve optimum performance generally at system 10. The circular metal wafers 16 may be no larger than the diameter of the aventurine crystal 12 layer. It will be appreciated that other metals and/or materials may be utilized for layers 16 without straying away from the concepts disclosed herein. Goop trademark adhesive, or other types of adhesives may be used to bond the silver metal wafers 16 to the aventurine crystal 12 layer. Other construction techniques may be utilized as desired. Barrier 22 may include ferrite and manganese/zinc or nickel/zinc powder and/or combinations of other materials. Manganese/zinc ferrites have a high permeability while nickel/zinc ferrites have a low permeability. Permeability is the measure of a materials ability to concentrate lines of magnetic flux. The ratio of manganese to zinc or nickel to zinc determines the grade of material. The finely divided metal oxide magnetic materials mentioned above may have a mean particle size of 1 to 30 micrometers. The magnetic powder resulting from combinations of FE*2O*3 (ferrite) with ZnO, NiO, MnO or other metal oxide materials may be enclosed as necessary, in a dielectric film packet, barrier 22, the composition which may be mylar, polypropelene, teflon or other dielectric film material. The thickness of the dielectric film packet material, barrier 22, may be 2 to 4 millimeters and is not critical. The weight of the metal oxide magnetic materials mentioned above or combinations of other materials in a sealed dielectric film packet, barrier 22, may depend on the amplitude of electromagnetic radiation and amplitude of the surrounding (EMI)/(RFI) of the item to be protected/circuitry 30. The weight of the metal oxide magnetic materials or combinations of other materials in a sealed dielectric packet, barrier 22, may regulate the effectiveness of the active electromagnetic filter invention. Generally, the amount of powdered metal oxide magnetic materials or combinations of other materials used for the barrier 22, may be great enough to form a layer that extends uniformly from one end of dielectric film packet, barrier 22, to the other in all directions. The dimensions of the dielectric film packet, barrier 22, may be determined generally by the surface area of the item to be protected/circuitry 30. Barrier 22 may be activated by the magnetic field from the rest of the system 10. Shield 18 may be a copper foil, or other material and may prevent outside electromagnetic radiation different than the activation electromagnetic wavelength from affecting the operation of system 10. Furthermore, the shield 18 may act as a light shield 18 and medium for the desired effect of the overall system 10. Shield 18 may be coupled to the ground plane of the item to be protected/circuitry 30 to create a Faraday cage which may further reduce unwanted electromagnetic interference (EMI) and radio frequency interference (RFI) from the item to be protected/circuitry 30, however coupling the shield 18 to the ground plane of the item to be protected/circuitry 30 may not be required for the operation of system 10, FIG. 1 or system 40, FIG. 2. Shield 18 may be united around the circular metal wafers 16-aventurine crystal 12 unit by means of a kapton-type tape, a dielectric film tape with a pressure sensitive adhesive on one side, an adhesive composition or the like. Other materials may be used to unite shield 18 as desired. The nature and thickness of the medium red aventurine crystal 12, may regulate the light absorption properties of the substance as mentioned above. Generally, translucent varieties of medium red aventurine may be preferred, however the exact thickness of the aventurine crystal 12 may not be practical to calculate given the complex nature of aventurine crystal 12 substances. Exact solutions are rarely practical. However any thickness of medium red aventurine chosen as desired for the crystal 12, may produce a particularity remarkable effect. It should be noted that the diameter of the aventurine crystal 12 may be no larger than the diameter of layers 16 mentioned above. A small flat magnet 20 may be positioned adjacent the shield 18 to further enhance the filter effects of system 10. The small flat magnet 20 may also be bonded to the light shield 18 and barrier 22 with goop-trademark adhesive or other types of adhesives so that the small flat magnet 20 is in alignment with the circular metal wafers 16-aventurine crystal 12 unit mentioned above. Again, other construction techniques may be utilized as desired. System 10 may stabilize magnetic field energy in and around circuitry 30 and/or other items to be protected. Furthermore, there may be no insertion loss for the system as there is no direct connection to circuitry 30 or other items to be protected. Although circuitry 30 has been shown as that to be protected, many different electronic and electromagnetic devices may be protected and the (EMI)/(RFI) may be shielded from many different systems including sensors, power sources, transformers, LCD screens, communication cables, computers, audio equipment, video equipment, and the like, etc. FIG. 2 shows an exemplary embodiment of, a active Electromagnetic filter invention system, generally at 40. System 40 may be a top view of a system similar to the one in FIG. 1. System 40 may include a medium red aventurine layer 42 as well as an external electromagnetic radiation source 44. External electromagnetic radiation source 44 may be coupled to optic material 54 which may configured to be adjacent to medium red aventurine layer 42 such that optic material 54 will transmit electromagnetic radiation from external electromagnetic-radiation source 44 to medium red aventurine layer 42. Further shown in FIG. 2 is metal layers 46 similar to the circular metal wafers 16 described above and this portion of the system may be enclosed in copper foil shield 18 48 which may again be similar to the shield 18 described above in FIG. 1. It will be appreciated that many different electromagnetic radiation sources may be utilized, including solar energy with appropriate filters as well as many others. Electromagnetic radiation in the 620 nanometer range may be useful in activating the medium red aventurine to provide the magnetic properties desirable for the system, however other wavelengths may be utilized, without straying from the concepts disclosed herein. Similarly, different minerals, (organic, inorganic, natural or synthetic) may be utilized for their different properties along with different wavelengths of electromagnetic radiation to achieve similar results. Metal layers 46 may be located on either side of the medium red aventurine layer 42 in a sandwich-like configuration. This may stimulate a mild electromagnetic field and act as a medium for the desired effect of the overall system. Although fiber optic material 54 has been shown, other types of materials and configurations for transmitting electromagnetic radiation may be utilized without straying from the concepts disclosed herein. Exemplary embodiments may include of two thin circular silver metal wafers 16 with a layer of crystal 12 positioned therebetween. Electromagnetic radiation sources, producing a wavelength of approximately 620 nanometers or optical filter of approximately 620 nanometers (wavelength) may be positioned in a circular fashion around the medium red aventurine (crystal 12) layer sandwiched between the two (2) silver metal discs 16. This entire assembly may be then substantially and/or completely enclosed by a thin layer of copper metal foil shield 18. Any gauge of copper foil may be used in construction, however preferred types of copper foil may be flexible for ease of assembly when constructing the copper metal foil shield 18. Other construction techniques may be utilized for shield 18. A small flat magnet 20 FIG. 1 may be positioned adjacent the copper foil, which may be attached with kapton-type tape or other materials as desired to the copper metal foil shield 18, FIG. 1. According to the present invention the small flat magnet 20, FIG. 1 may be one that can produce an appreciable magnetic field external from themselves. Soft ferromagnetic materials and hard ferromagnetic materials such as but not limited to neodymium, sumarium cobalt, alnico may be used as the flat magnet 20, FIG. 1. Electromagnets may be substituted for the small flat magnet 20, FIG. 1. Hard ferromagnetic materials may be preferred when constructing the active electromagnetic filter invention. The nature of the items to be protected/circuitry 30, barrier 22, aventurine crystal 12-circular metal wafers 16 unit may determine the magnetic field strength of the magnet 20 which may regulate the effectiveness of the active electromagnetic filter. Preferably it may be desirable to use a small flat magnet 20 with the same or greater diameter as the silver circular wafers 16 as illustrated in FIG. 1. The opposite side of the magnet 20 may be adjacent to a sealed dielectric film packet 22, FIG. 1 filled with ferrite and maganese/zinc or nickel/zinc powder. The exemplary embodiments may remove/absorb/shield 18/radio frequency interference (RFI)/electromagnetic interference (EMI) and may stabilize magnetic field energy. Exemplary embodiments disclosed herein may be an introduction to a new type of technology. Light, or visible electromagnetic radiation, may be a source of power, which excites the crystal 12 aventurine (medium red color). Aventurine may be deposited between two circular silver metal discs. Light emitting diodes approximately 620 nanometers wavelength, Toshiba part mfg.# TloH190p. Peak emission wavelength: 620 nm, 18,000 to 36,000 MCD luminous intensity or equivalent) and/or optical filter (approximately 620 nanometers) may be placed about the periphery of the aventurine crystal 12 layer. Light emitting diodes or optical filter (internal electromagnetic radiation source 14) mentioned above may be secured to aventurine crystal 12 with Goop-trademark adhesive or other types of adhesives as desired so that the 620 nanometer wavelength electromagnetic radiation source is directed at the aventurine crystal 12. An opening may be provided around the periphery of the shield 18 to allow the transmission of solar energy to the optical filter (620 nm wavelength) mentioned above. In an alternative embodiment illustrated in FIG. 2 and mentioned above, external electromagnetic radiation source 44 may be coupled to fiber optic material 54 which may be placed about the periphery of the aventurine layer 42 such that fiber optic material 54 will transmit electromagnetic radiation from external electromagnetic radiation source 44 to medium red aventurine layer 42. Optic material 54 may be any material such as but not limited to glass or plexiglass that are transparent to rays of light. Fiber optic material 54 may be secured about the periphery of the aventurine layer 42 with goop trademark adhesive or other types of adhesives, however other construction techniques may be utilized as desired. A opening may be provided in the copper foil shield 18, FIG. 1/48 FIG. 2, for the fiber optic material 54 to transmit the 620 nanometer wavelength electromagnetic radiation from the external electromagnetic radiation source 44 to the medium red aventurine crystal 12 layer 42 as shown in FIG. 2. The opening in the copper foil shield 18, FIG. 1/48 FIG. 2, for the fiber optic material 54 may be surrounded with opaque material to prevent external electromagnetic radiation of different wavelengths from entering the metal layers 46/medium red aventurine layer 42 unit. Opaque material such as black plastic adhesive tape or other opaque materials may be used as desired. As illustrated in FIG. 2, external electromagnetic radiation source 44 may be a optical filter (620 nm wavelength) joined to optic material 54 for the transmission of solar energy or a housing containing light emitting diodes (620 nm wavelength), laser (620 nm wavelength), light bulb with optical filter (620 nm) or other sources of visible electromagnetic radiation furnishing artificial light which may provide continuous electromagnetic radiation at the approximately 620 nanometer wavelength spectrum without unwanted variations in luminance or chrominance and may maintain color temperature. In the preferred embodiment of the external electromagnetic radiation source 44 apparatus a direct current (DC) power supply or battery may be used as a source of power for the artificial light source to reduce luminance flicker and color flicker. The shape and structure of the housing may be any shape and structure selected as desired, so as to enclose the entire assembly of the artificial light source. The external electromagnetic radiation source 44 housing may be constructed of any materials that are impenetrable to light. It should be further understood that internal electromagnetic radiation source 14 as illustrated in FIG. 1, is internalized within shield 18 and external electromagnetic radiation source 44 as illustrated in FIG. 2, is external and coupled to the medium red aventurine layer 42 layer by fiber optic material 54. The external electromagnetic radiation source 44 housing illustrated in FIG. 2 may be constructed of opaque materials such as metal/black plastic or other opaque materials as desired to prevent external electromagnetic radiation different from the activation wavelength from entering the external electromagnetic radiation source 44 housing. External electromagnetic radiation source 44 housing will have an opening which may be coupled to fiber optic material 54, which may also may be surrounded with opaque materials to prevent external visible electromagnetic radiation different from the activation wavelength from entering the fiber optic material 54 and external electromagnetic radiation source 44 housing. The opening of the external electromagnetic radiation source 44 housing mentioned above means any opening provided for the purpose of transmitting electromagnetic radiation which may be required for the operation of system 40, as illustrated in FIG. 2. The active electromagnetic filter invention may use a external electromagnetic radiation source 44 or internal electromagnetic-radiation source 14 that may transmit the visible electromagnetic radiation activation wavelength (620 nm wavelength) at a typical luminosity of 450 candelas directed at the aventurine (medium red color)

crystal 12 layer. While a luminous intensity of 450 candelas may be preferred to activate the aventurine (medium red color) crystal 12 layer, greater or lesser amounts of illumination (luminous intensity) may be used for activation of the aventurine crystal 12. The invention may utilize an unconventional approach not previously known, using minerals (medium red aventurine), (inorganic, natural or synthetic), which may have magnetic properties when activated by a specific electromagnetic radiation wavelength, and charged by a magnetic field to enhance the properties of powdered ferrite and manganese/zinc or nickel/zinc material when placed in close proximity to an electronic/electromagnetic device to be protected. The final result may be a radio frequency interference (RFI)/electromagnetic interence (EMI) with superior properties than standard filters used today. It may further have the advantage of stabilizing magnetic field energy. There may be no insertion loss for the active electromagnetic filter, because there is no direct connection to the electronic circuit/transformer/transducer/or sensor, etc., only direct proximity thereto. Standard filters available on the market today may incorporate capacitors, inductors, or transformer. They may all have insertion loss and may not be very effective even though they are readily used. Another type of filter may be metal oxide magnetic materials, ferrites, which may be inefficient and may absorb some of the alternating current/direct current signal or power, which may be problematic for use with electronics. An approximately 620 nanometer wavelength light source, which may be continuous and not pulsed, may be directed at a aventurine crystal 12 located between two circular silver discs 16 (other metals may be utilized, as desired). The circular silver discs 16 may act as a medium for the desired effect of the overall system and may stimulate a mild electromagnetic field for a greater bond. The approximately 620 nanometer wavelength light source may cause the crystal 12 to vibrate at a continuous frequency into resonance. A copper foil shield 18 may be placed around the crystal 12 and silver discs 16 assembly to prevent external electromagnetic radiation of other wavelengths from entering. The shield 18 may also stimulate a mild electromagnetic field for a greater bond. A magnet 20 may be placed between the copper metal foil shield 18 containing the aventurine crystal 12-silver discs 16 unit, and a sealed dielectric film packet of powdered ferrite, barrier 22, such as but not limited to, a low density ceramic material with composition FE*2O*3 (X O where X may be a divalent metal such as cobalt, nickel, manganese, or zinc. The magnet 20 may couple a magnetic field through the aventurine crystal 12-silver discs 16 unit wrapped in copper foil and the powdered ferrite dielectric film packet, barrier 22. A magnetic circuit may be therefore produced. The unified action of the aventurine crystal 12-silver discs 16 unit vibrating at a continuous frequency coupled with a magnetic field to the metal oxide magnetic material (ferrites) may cause the properties of metal oxide magnetic materials (ferrites) to change. This effect may enhance the (EMI)/(RFI) protecting abilities of the system and may stabilize the magnetic field energy of the items to be protected/circuitry 30. Some applications for exemplary embodiments may include: Electronic circuit boards to reduce EMI/RFI to meet or exceed government standards, speakers, microphones, headphones, electronic and electric musical instruments, motors, transformers, digital equipment (industrial, scientific, medical), analog equipment (industrial, scientific, medical) radio and television broadcast equipment, RF stoppers, sound and video recording equipment, amplifiers, entertainment: (DVD players/recorders, video cameras), computers, communication systems, wire cables, among others. In closing, it is to be understood that the embodiments described herein are illustrative of the principals of the pre-sent disclosure. Other modifications that may be employed are within the scope of the disclosure. Thus by way of example, but not of limitation, alternative configurations may be utilized in accordance with the teachings herein. Accordingly, the drawings are illustrative and not meant to be a limitation thereof.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. An active electromagnetic filter for an item to be protected, the filter comprising:

An electromagnetic radiation source having an activation wavelength optically connected to a crystal, the crystal excited by the electromagnetic radiation source activation wavelength;

Metal wafers parallel to each other on top and bottom of the crystal;

A shield for the prevention of external electromagnetic radiation different from the activation wavelength from entering the crystal, the shield enclosing said crystal;

A magnet for coupling a magnetic field through the crystal and a barrier;

The barrier utilized with the crystal, the shield and the magnet for the suppression of electromagnetic interference and radio frequency interference when positioned adjacent the item to be protected.

* * * * *